(12) United States Patent
Lau

(10) Patent No.: US 6,209,075 B1
(45) Date of Patent: *Mar. 27, 2001

(54) METHOD AND APPARATUS FOR EXTENDING MEMORY OF AN INTEGRATED CIRCUIT

(75) Inventor: Lee K. Lau, Don Mills (CA)

(73) Assignee: ATI Technologies, Inc., Thornhill (CA)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/841,284

(22) Filed: Apr. 29, 1997

(51) Int. Cl.$^7$ ........................................ G06F 12/00
(52) U.S. Cl. ............................ 711/171; 711/1; 711/2; 711/170; 711/171; 711/129; 711/212
(58) Field of Search ................... 711/170, 171, 711/172, 173, 2, 115, 1, 212, 129

(56) References Cited

U.S. PATENT DOCUMENTS

| | | | |
|---|---|---|---|
| 3,993,981 | * 11/1976 | Cassarino, Jr et al. | 710/114 |
| 4,788,656 | * 11/1988 | Sternberger | 710/52 |
| 5,349,661 | * 9/1994 | Brewer et al. | 395/651 |
| 5,357,621 | * 10/1994 | Cox | 711/172 |
| 5,402,014 | * 3/1995 | Ziklik et al. | 326/37 |
| 5,440,241 | * 8/1995 | King et al. | 324/765 |
| 5,566,309 | * 10/1996 | Tamura | 711/5 |
| 5,663,654 | * 9/1997 | Wood et al. | 324/758 |
| 5,704,055 | * 12/1997 | George et al. | 711/2 |
| 5,726,580 | * 3/1998 | Wood et al. | 324/758 |
| 5,732,266 | * 3/1998 | Moore et al. | 395/651 |
| 5,798,971 | * 8/1998 | Larson et al. | 365/189.05 |
| 5,956,252 | * 9/1999 | Lau et al. | 364/468.28 |

* cited by examiner

Primary Examiner—Do Yoo
Assistant Examiner—Mehdi Namazi
(74) Attorney, Agent, or Firm—Markison & Reckamp, P.C.

(57) ABSTRACT

A method and apparatus for extending an on-chip processing device's access to memory are accomplished by depositing a processing circuit, memory, and configuration circuitry on a die. When the memory has sufficient digital storage capabilities for the processing circuit, the configuration circuitry directly couples an address bus and data bus between the memory and the processing device. When the memory does not have sufficient digital storage capabilities for the processing circuit, the configuration circuitry reconfigures the memory. In additional, the configuration circuitry extends the address bus to an external memory and combines the internal data bus with an external data bus. Configured in this manner, the processing device can access both the on-chip memory and the external memory as a single addressable memory, thereby increasing the memory available to the processing circuit.

8 Claims, 7 Drawing Sheets

METHOD AND APPARATUS FOR EXTENDING MEMORY OF AN INTEGRATED CIRCUIT

TECHNICAL FIELD OF THE INVENTION

This invention related generally to integrated circuits and more particularly to a method and apparatus for extending an on-chip processing device's access to memory.

BACKGROUND OF THE INVENTION

Integrated circuits (IC) are known to include a multitude of electronic components deposited on a silicon substrate, or other type of substrate. The multitude of electronic components provide an almost endless combination of functional possibilities. For example, the electronic components may be interconnected to provide a volatile or non-volatile memory, a processing circuit such as a microprocessor, digital signal processor, microcontroller, a video graphics processor and so on.

As is also well known in the art, the processing speed of processing circuits is increasing at a faster rate than the storage capacity of memory devices. As such, if an integrated circuit is fabricated to include a processing device and memory, the memory may not provide sufficient digital storage for the processing device when it is running data intensive algorithms. Such data intensive algorithms may be video graphics programs, audio processing programs, database manipulation programs, etc. When this situation arises, the processing device reduces its processing speed to accommodate the memory or it cannot execute the application due to insufficient memory.

One rather obvious solution to the above mentioned problem is to simply include more memory on the integrated circuit. While this is possible, it increases the die size and subsequently increases the integrated circuit size and power dissipation. Because of the increase in the die size, the amount of additional memory is limited.

Another solution is to decrease the size of the memory such that more memory fits within the same die area. While this has helped greatly to increase the amount of on-chip memory, it is still not enough. As previously mentioned, the technical advances with respect to the speed of processing devices is happening more rapidly than the technical advances with respect to memory. Thus, the gap between sufficient on-chip memory and the processing speed of on-chip processors is growing.

Currently, off-the-self Random Access Memory (RAM) is commercially available in 1 Mbyte blocks of 128 K by 64 bits or 256 K by 32 bits. Such blocks may be combined to produce larger memory blocks. For example, two blocks may be combined to produce a 2 Mbytes RAM configured as 256 Ks by 64 bits. In many IC applications, 2 Mbytes of RAM, which is customized for on-chip applications, is the most memory that can be deposited on a die and keep the die size within acceptable limits; i.e., less than 12 mm by 12 mm.

Even with 2 Mbytes of RAM, many processing circuits, deposited on the same die, are capable of running applications that require more than 2 Mbytes of memory. But, are slowed to accommodate for the lack of memory capacity, or worse, cannot perform the application because of insufficient memory. Therefore, a need exists for a method and apparatus that allows an on-chip processing device to access more memory than is available on-chip without having to slow its processing speed and without being limited as to which applications it can perform.

DETAILED DESCRIPTION OF THE DRAWINGS

Generally, the present invention provides a method and apparatus for extending an on-chip processing device's access to memory. This may be accomplished by depositing a processing circuit, memory, and configuration circuitry on a die. When the memory has sufficient digital storage capabilities for the processing circuit, the configuration circuitry directly couples an address bus and data bus between the memory and the processing device. When the memory does not have sufficient digital storage capabilities for the processing circuit, the configuration circuitry reconfigures the memory. In addition, the configuration circuitry extends the address bus to an external memory and combines the internal data bus with an external data bus. Configured in this manner, the processing device can access both the on-chip memory and the external memory as a single addressable memory, thereby increasing the memory available to the processing circuit. With such a method and apparatus, an on-chip processing circuit is is now able to process highly computational algorithms nor does it have to slow its processing speed due to memory constraints, thereby allowing the integrated circuit to be more efficient.

Figure 1:
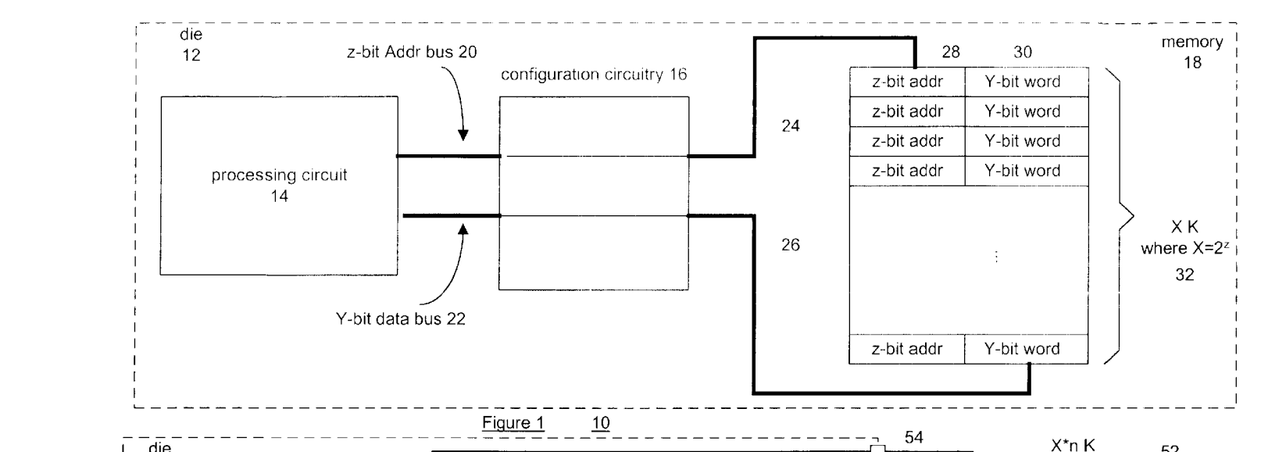
FIG. 1 illustrates a schematic block diagram of an IC having configuration circuitry in a first configuration which is in accordance with the present invention.

The present invention can be more fully described with reference to FIGS. 1–8. FIG. 1 illustrates a schematic block diagram of an integrated circuit (IC) 10 which includes a die 12, a processing circuit 14 deposited on the die, configuration circuitry 16 deposited on the die, and memory 18 deposited on the die. The IC 10 also includes a plurality of pads, input/output circuitry, addressing circuitry, program control circuitry, testing circuitry, and packaging (not shown). The functionality of these non-shown components is well understood in the art, thus no further discussion will be presented except to facilitate the understanding of the present invention.

The processing circuit 14, which may be a microprocessor, microcomputer, microcontroller, digital signal processor, or a video graphics processor and associated addressing interface and data interface circuitry, is coupled to the configuration circuitry 16 by a z-bit address bus 20 and a Y-bit data bus 22. The particular values for z and Y are dependent upon the configuration of memory 18; where $x=2^z$ and Y=word length. Memory 18 is shown to include an address field 28, a word field 30, and is of X K in length. In one embodiment, for example, memory 18 would be a 2 Mbyte RAM, X would be 128, Y would be 128, and z would be 17. In this arrangement, the processing device, using 17-bit addresses, would be able to access 128,000 different 128 bit words from memory 18. If this is sufficient digital storage for the processing device 14, the configuration circuitry 16 is coupled as shown.

When memory 18 has sufficient digital storage capacity for the processing device 14, the configuration circuitry 16 directly couples the processing device 14 to memory 18 via the z-bit address bus 20, address bus 24, the Y-bit data bus 22, and data bus 26. In essence, when memory 18 has sufficient digital storage capability for the processing circuit 14, the configuration circuitry 16 effectively removes itself from the circuit.

Figure 2:
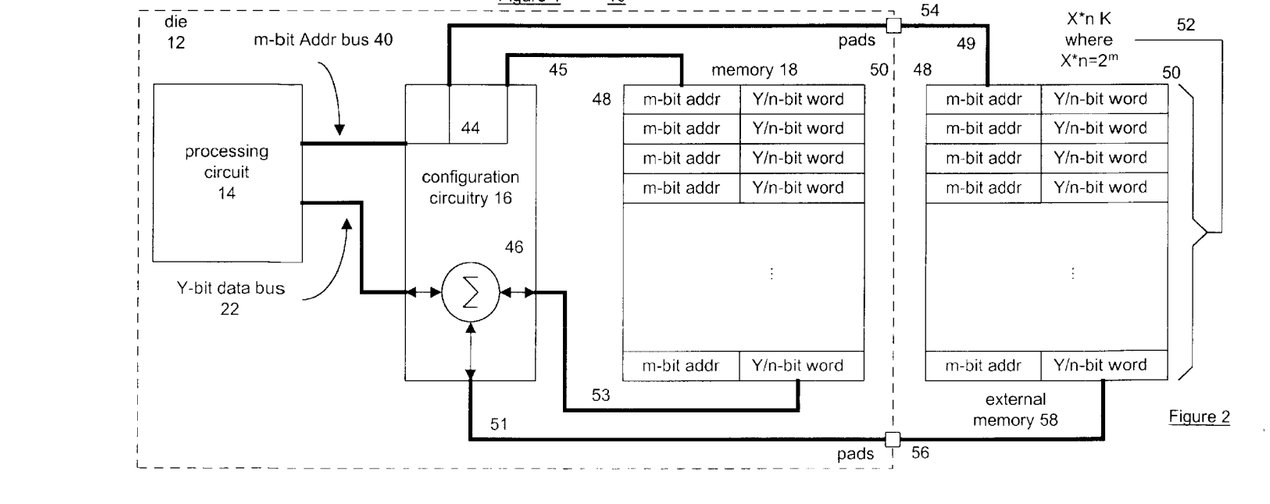
FIG. 2 illustrates a schematic block diagram of an IC having configuration circuitry in a second configuration which is in accordance with the present invention.

FIG. 2 illustrates a schematic block diagram of the IC 10 coupled to an external memory 58. In this embodiment, the internal memory 18 does not have sufficient digital storage capacity for the processing device 14. As such, the configuration circuitry 16, which may be a memory manager, co-processor, or other programmable circuit, reconfigures the memory 18 to include X*n K of entries, where each entry includes Y/n bit word. Due to the increase in the number of entries in the memory, the address is changed to an m-bit address, where X*n K=$2^m$ 52. Thus, if memory 18 is a 128 K by 128 bits, it may be reconfigured to 256 K by 64 bit memory, i.e., n=2. In this configuration, the address field 48 now contains 18-bit addresses for each of the ~256,000 entries.

Reconfiguration of memory 18 involves changing bit-line connections of the memory blocks to re-arrange the addresses of the blocks. For example, if memory 18, in its original state, is a 128K by 128 bit memory, it contains four 128 K by 32 bit memory blocks arranged in a one by four configuration. The row of four memory blocks have their bit lines coupled to receive addresses as a single addressable memory block. When the memory is reconfigured to a 256 K by 64 bit memory, the bit line coupling is changed such that the eight blocks are arranged in a two by two configuration, i.e., two rows of two memory blocks.

Having reconfigured the memory 18, the configuration circuitry 16 also reconfigures the address bus 20 and the data bus 22. As shown, the configuration circuitry 16 creates an m-bit address bus 40 by coupling 44 an internal address bus 45 with an external address bus 49, via pads 54. In addition, the memory 18 and the external memory 58 are arranged to have identical addresses 48, such that one of the memories stores a first portion of a word 50 and the other memory stores the remaining portion of the word 50. In this manner, the processing device 14 may address memory 18 and the external memory 58 as a single addressable memory. The processing device, however, needs to be aware that the memory has reconfigured such that it is using m-bit addresses as opposed to z-bit addresses.

To reconfigure the data bus, the configuration circuitry 16 includes a bi-directional summation circuit 46. The summation circuit 46 receives, in one direction, data from the memories 18 and 58 via data buses 51 and 53, wherein data buses 51 and 53 are Y/n bit buses. Upon receiving data via the buses 51 and 53, the summation circuit 46 combines the data into a single Y-bit word which is routed, via the Y-bit data bus 22, to the processing device 14. The configuration circuitry 16 insures that the received data portions from the memories 18 and 58 are properly arranged to produce the desired Y-bit data word.

For data generated by the processing device 14 that is to be stored, the summation circuit 46 receives the Y-bit word and divides it into n Y/n-bit words. The first Y/n-bit word is provided to the internal memory 18 via the Y/n data bus 53, while the remaining Y/n-bits words are provided to the external memory 58 via the Y/n data bus 51. Note that the Y/n data bus 51 is coupled to pads 56, which provide data access into and out of the integrated circuit 10. By reconfiguring the memory as described, the number of pads needed to access the external memory is reduced. Thus, for n=2 and a 128 K by 128 bit internal memory, only sixty four data pads 56 are needed as opposed to 128, if the external memory were simply coupled in parallel to the internal memory. As one skilled in the art will readily appreciate, by reducing the number of required pads, a die can be smaller and manufactured more cost effectively.

By including the configuration circuitry 16 on the IC 10, the processing device 14 has access to significantly more digital storage than the internal memory 1 8 can provide. As such, the processing device 14 does not have to slow down its processing speed to accommodate the internal memory 18, nor is it prevented from executing applications due to insufficient memory. The configuration circuitry 16 reconfigures the internal memory 18, which is originally an X K by Y bit memory, to an X*n K by Y/n bit memory, where X is in the range of $2^7$ to $2^{16}$ and n is in the range of 1 to 4. The reconfigured memory is then coupled in parallel with one or more external memories.

Note that n does not have to be only 2. For example, if the processing device 14 needs four times more memory access, the internal memory could be reconfigured accordingly to provide 25%, of the Y-bit word while multiple external memories, or an external memory would provide 75% of the Y-bit word. Such could be the case if Y is 128 and X is 128. As such, the internal memory, in its original state, would include a 1 by 4 memory block arrangement. Reconfiguring the internal memory to a 4 by 1 memory block arrangement changes the internal memory to a 512 K by 32 bit memory. If the external memory is a 512 K by 96 bit memory, accessing the two in parallel would be equivalent to accessing a 512 K by 128 bit memory, which has four times more storage capacity than a 128 K by 128 bit memory.

Figure 3:
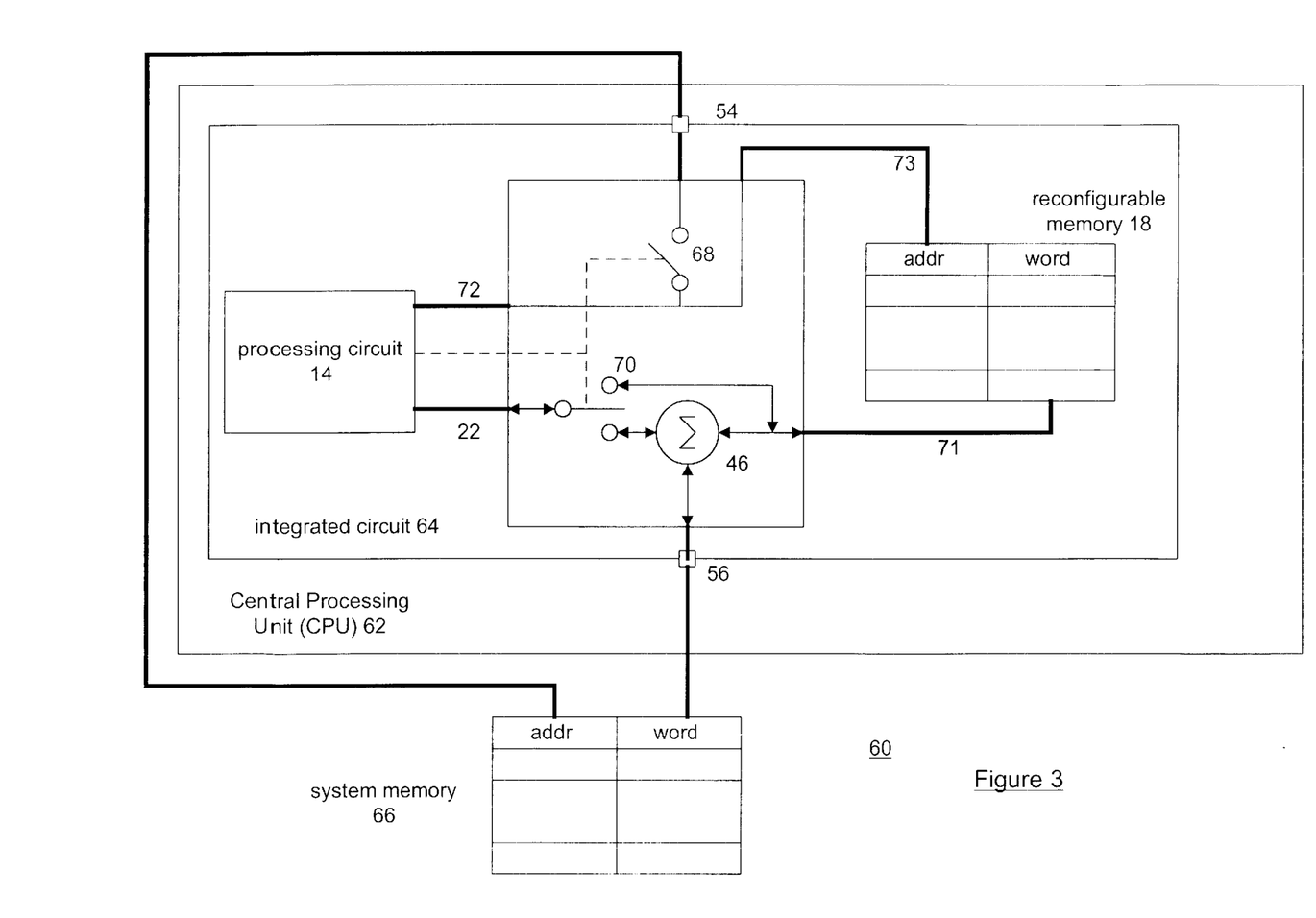
FIG. 3 illustrates a schematic block diagram of a computing system which is in accordance with the present invention.

FIG. 3 illustrates a schematic block diagram of a computing system 60 that includes a central processing unit 62 and system memory 66. As one skilled in the art will readily appreciate, a complete computing system would include more components than shown. But such additional components are not germane to the present invention and, as such, are not presented or discussed. The central processing unit (CPU) 62 is shown to include an integrated circuit 64 which includes the processing circuit 14, the configuration circuitry 16, the internal memory 18, and pads 54 and 56. The processing circuit 14 may be a microprocessor, a microcontroller, a microcomputer, or a digital signal processor and associated addressing circuitry and data input/output circuitry.

The configuration circuitry 16 is shown to include a pair of switches 68 and 70, and the summation circuit 46. The pair of switches 68 and 70 are controlled by the processing device 14 to directly couple the processing device 14 via the address buses 72 and 73 and the data buses 22 and 71 to the internal memory 18 when the internal memory has sufficient digital storage capabilities.

When the internal memory 18 does not have sufficient digital storage capabilities, the processing device 14 controls the switches 68 and 70 to couple an external memory, in this case at least a portion of the system memory 66, through pads 54 and 56. In addition, the processing device 14, either directly or through the configuration circuitry 16, causes the internal memory to reconfigure itself as previously discussed. With such an IC, a new computing system is obtained that allows for extended memory access of on-chip processing devices.

Figure 4:
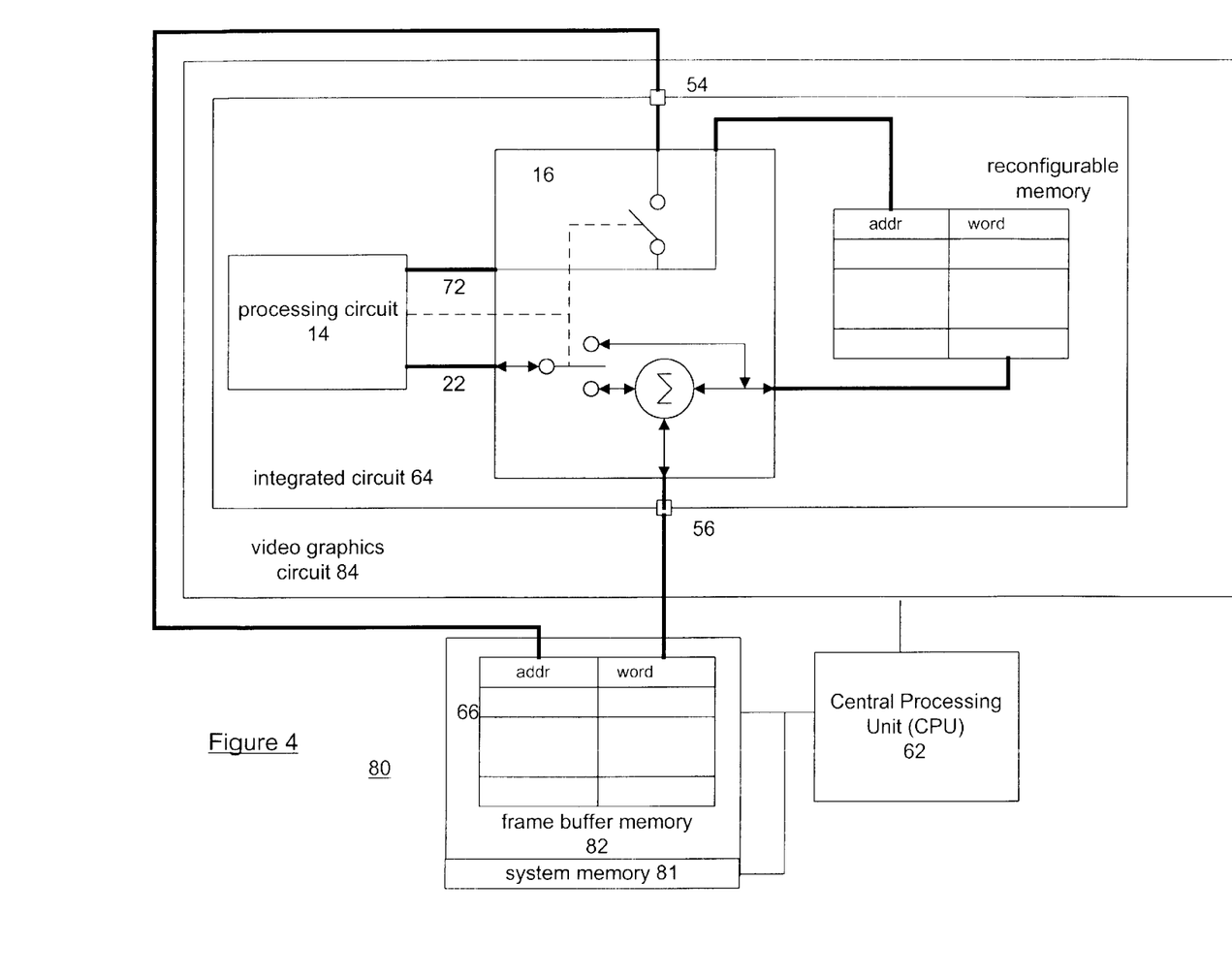
FIG. 4 illustrates a schematic block diagram of an alternate computing system which is in accordance with the present invention.

FIG. 4 illustrates a schematic block diagram of an alternate computing system 80 which includes a central processing unit (CPU) 62, system memory 81, frame buffer memory 82, and a video graphics circuit 84. The frame buffer memory 82 is shown to include at least a portion of the external memory 66 which may be accessed by the processing device 14 as previously discussed. The video graphics circuit 84 includes an integrated circuit 64, which., in turn, includes the processing device 14, the configuration circuitry 16, and the internal reconfigurable memory 18. Note that the processing circuit 14 may be a video graphics processor.

Figure 5:
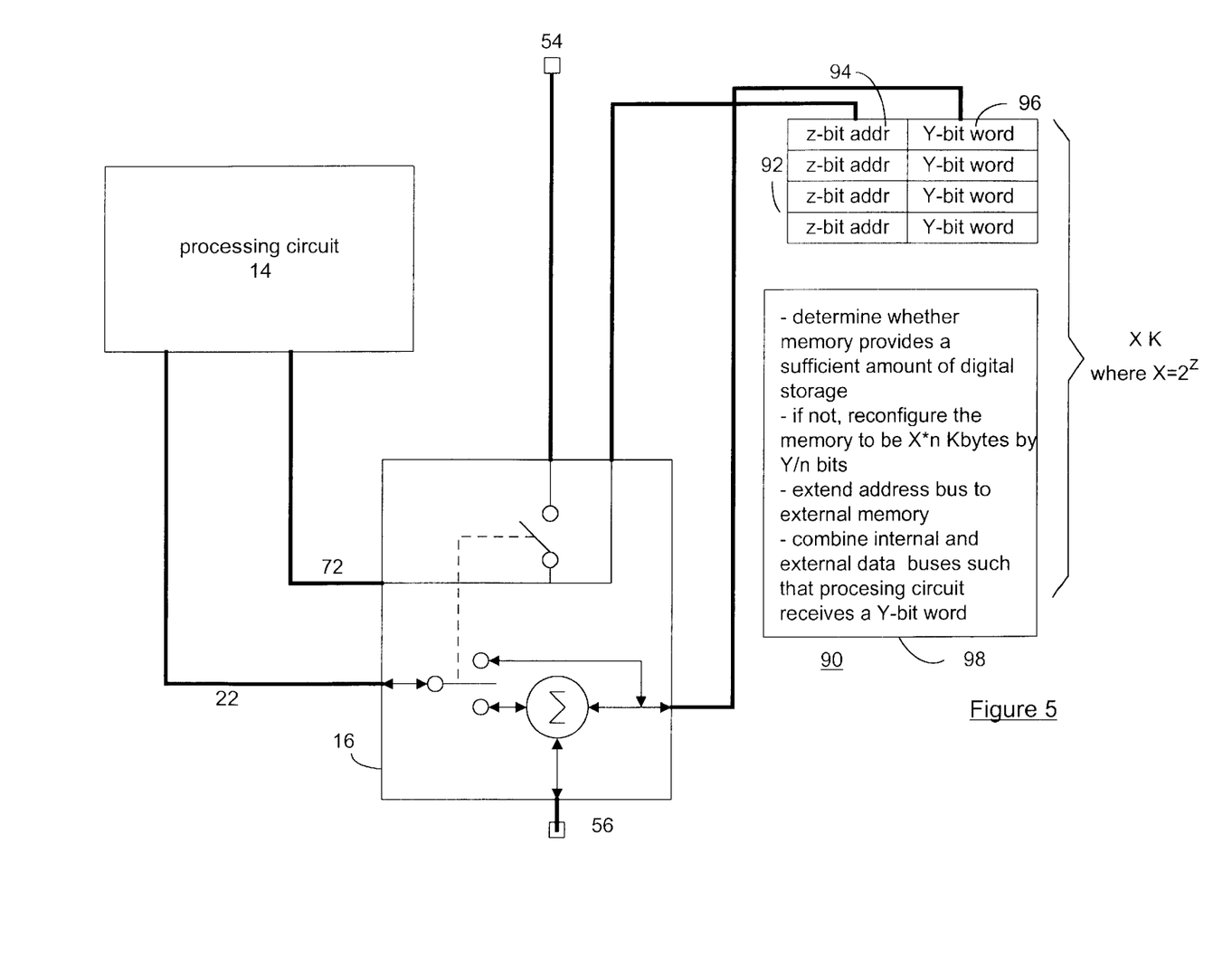
FIG. 5 illustrates a schematic block diagram of an IC which is in accordance with the present invention.

FIG. 5 illustrates a schematic block diagram of an IC 90 which includes the processing device 14 deposited on a die, configuration circuitry 16 deposited on the die, and memory 92 and 98 deposited on the die. The memory 92 includes a z-bit address field 94, a Y-bit word field 96, and X Ks of entries. Such dimensions are similar to those previously discussed. The memory 98 is shown to include programming instructions which, when read by the processing device 14, causes the processing device 14 to determine if the memory has a sufficient amount of digital storage. If not, the processing device instructs that the memory be reconfigured to be $X*n$ K by $Y/n$ bits. Having done this, the processing device instructs the address bus to be extended to an external memory and an internal data bus to be combined with an external data bus. Having done this, the processing device 14 can access the internal memory 18 and the external memory as a single addressable memory device.

Figure 6:
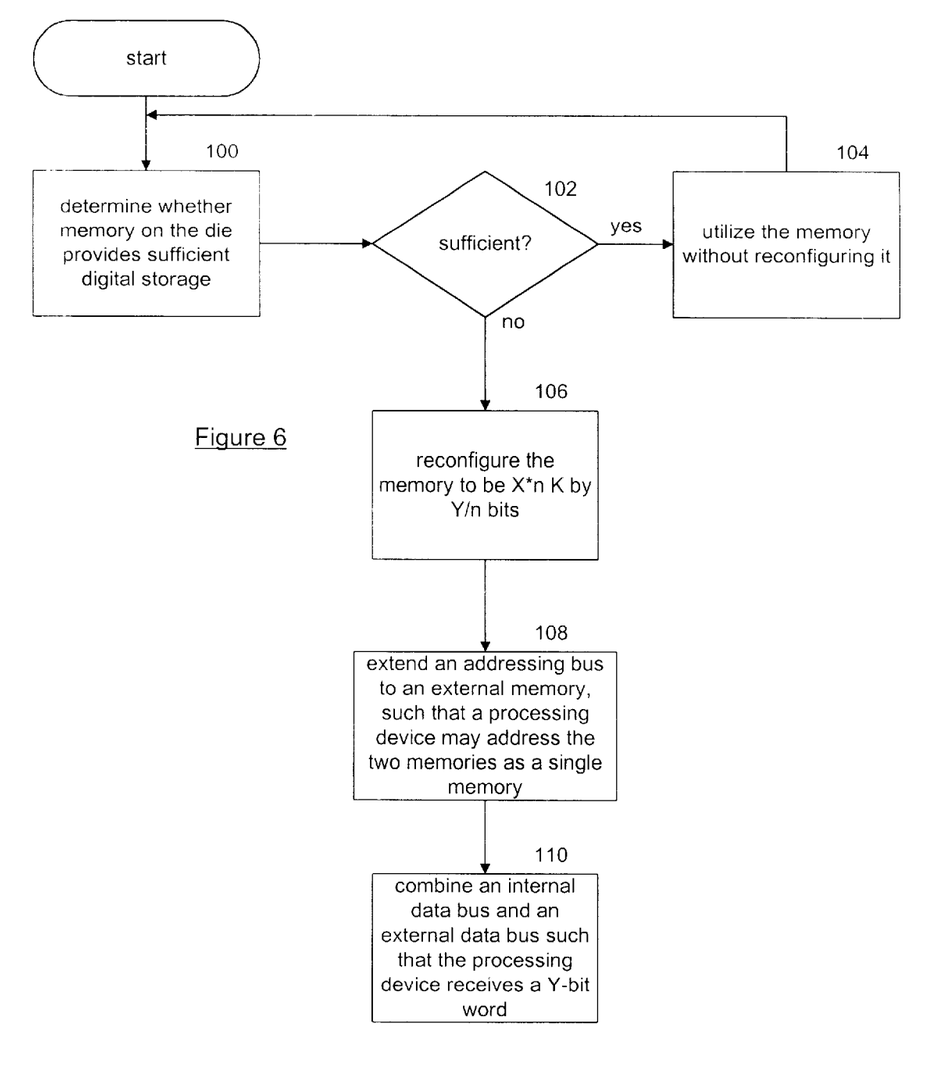
FIG. 6 illustrates a logic diagram that may be used to extend an on-chip processing circuit's access to memory in accordance with the present invention.

FIG. 6 illustrates a logic diagram that may be used to extend an on-chip processing circuit's access to additional memory. The process begins at step 100 where a determination is made as to whether the internal memory has sufficient digital storage capacity. The process then proceeds to steps 102 and 104 when there is sufficient digital storage capacity. At step 104, the processing device utilizes the internal memory without reconfiguring it. If, however, the internal memory does not have sufficient digital storage, the process proceeds to step 106 where the internal memory is reconfigured to be $X*n$ K by $Y/n$ bits. The process then proceeds to step 108 where the addressing bus is extended to an external memory such that the processing device may address the internal memory and the external memory as a single addressable memory. Next, the process proceeds to step 110 where an internal data bus is combined with an external data bus such that the processing device receives Y-bit words. The integrated circuit remains configured in this manner while the processing device is performing an application which required additional memory.

Figure 7:
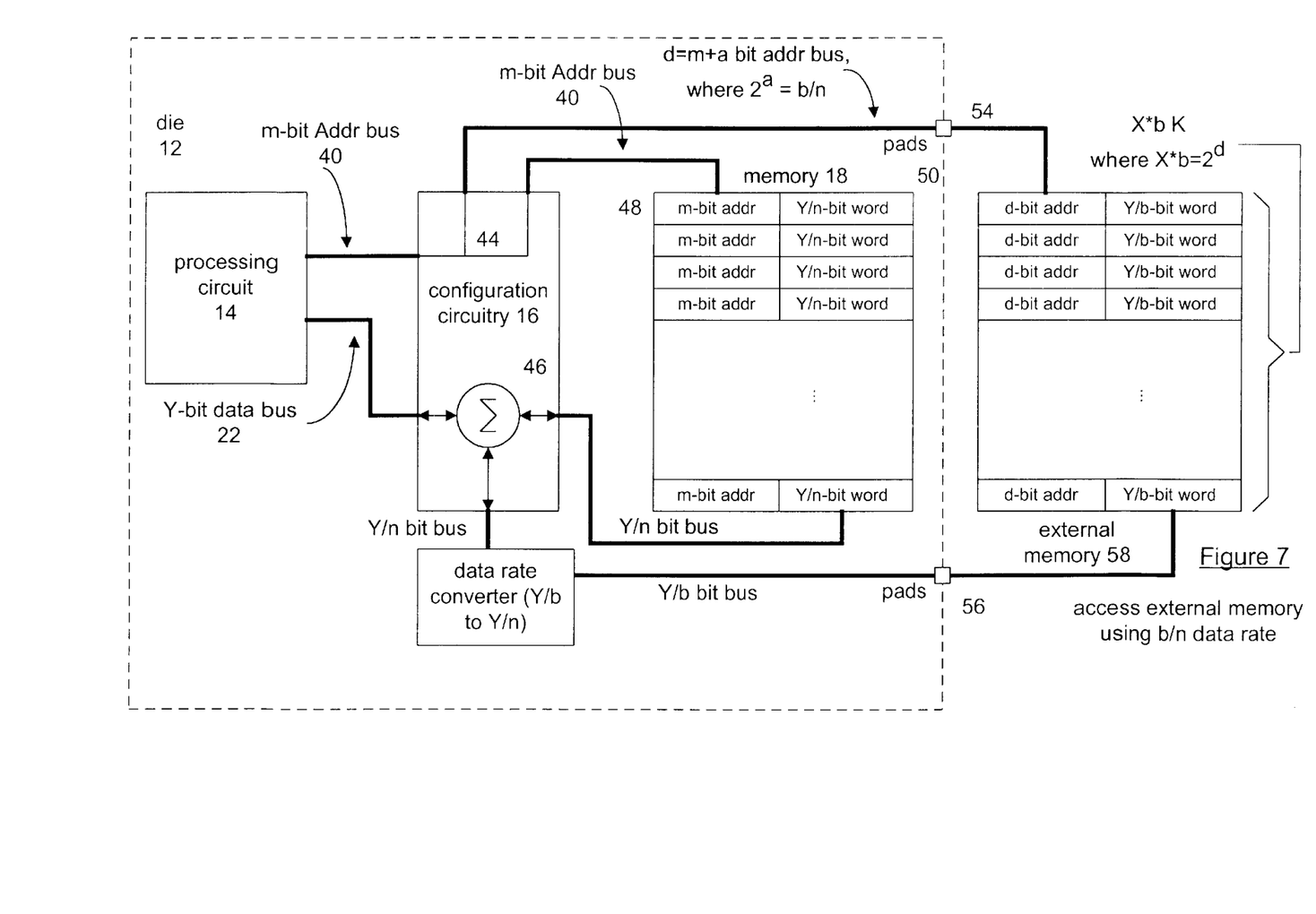
FIG. 7 illustrates a schematic block diagram of an IC coupled to an external memory having a b/n data access rate.

FIG. 7 illustrates the die 12 being coupled to an external memory 58. In this configuration, the external memory 58 is a multi data rate access memory. For example, the external memory 58 may be a double data rate memory such that data can be read from and written to on the leading and trailing edges of a clock signal. As shown, the internal memory 18 is reconfigured to be a $X*n$ K by $Y/n$ memory and the external memory is configured to be an $X*b$ K by $Y/b$ memory, where $X*b$ $K=2^d$, $d=m+a$, and $2^a=b/n$. The internal address bus is reconfigured to a d-bit address bus and the internal data bus is configured to a $Y/b$-bit data bus. The configuration circuitry 16 is shown to further include a data rate converter, which converts $Y/b$-bit data at the b/n data rate to $Y/n$-bit data at the nominal data rate.

As an example of the illustration of FIG. 7, assume that the external memory is a double data rate memory such that $b/n=2$. Further assume that the internal memory has been reconfigured from a 128 K by 128 bit memory to a 256 K by 64 bit memory, such that $X=128$, $Y=128$, and $n=2$. Solving for $b=2*n$, or 4, yields an external memory configured as $128*4$ K by $128/4$ bits, or 512K by 32 bits. The m-bit address bus is an 18 bit address bus ($128*2$ $K=2^m$, solving for m, has $m=18$). The d-bit internal address bus is a 19-bit address bus ($d=m+a$, where $2^a=4/2$, $a=1$). The Y/b-bit data bus is an 128/4, or 32-bit data bus, but receives data at twice the rate of the Y/n-bit data bus. The data rate converter receives the data from the external memory at the double data rate and converts it to 128/n data and the nominal data rate of the circuit.

Figure 8:
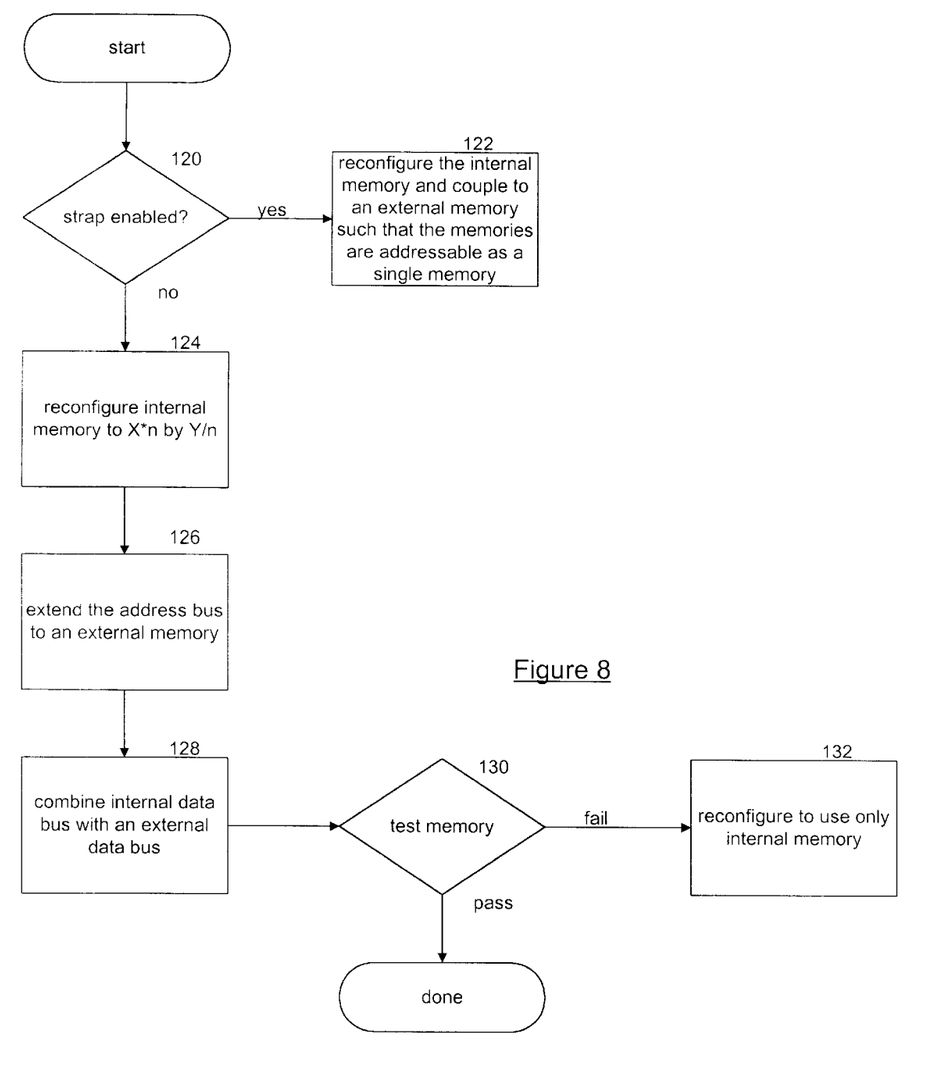
FIG. 8 illustrates a logic diagram to determine whether the IC has access to external memory.

FIG. 8 illustrates a logic diagram that may be used to determine if the on-chip processor has access to eternal memory. The process begins at step 120 where a determination is made as to whether a strap is enabled. A strap, which may be a pin, or pins, on the integrated circuit that are either pulled high, or low, to indicate the availability of external memory for use by the on-chip processing device. If the strap is enabled, the process proceeds to step 122 where the internal memory is reconfigured and coupled to the external memory, as previously discussed, such that the processing device may access the memories as a single addressable memory.

If the strap is not enabled, the process proceeds to step 124 where the internal memory is reconfigured from X K by Y-bit memory to an $X*n$ K by Y/n- bit memory. The process then proceeds to step 126 where the internal address bus is extended to the external memory. Having done this, the process proceeds to step 128 where the internal data bus is combined with an external data bus. With the buses reconfigured, the memories are tested, at step 130, to determine if the processing device can access the internal memory and the external memory as a single addressable memory. If the test passes, the process is done. If the test fails, the process proceeds to step 132 where the internal memory is reconfigured to an X K by Y-bit memory.

The preceding discussion has presented a method and apparatus that allows an on-chip processing device to access additional memory. This is generally accomplished by reconfiguring the internal, or on-chip, memory and extending an address bus to an external memory. In addition, an internal data bus is combined with an external data bus such that the processing device may access the internal memory and external memory as a single addressable memory device. By providing the processing device with access to additional memory, the processing device does not have to slow its processing speed to accommodate the internal memory, nor is it prevented from executing applications due to insufficient memory.

What is claimed is:

1. A method for reconfiguring an integrated circuit, the method comprising the steps of:

a) reconfiguring, in response to a determination that an internal memory is insufficient for a particular function, the internal memory deposited on a die from an X K by Y bit configuration to an $X*$ n K by Y/n bit configuration to produce reconfigured memory;

b) extending an addressing bus to external memory, such that a processing device deposited on the die addresses the reconfigured memory and the external memory as a single addressable memory;

c) combining an internal data bus with an external data bus that is coupled to the external memory; and d) testing the reconfigured memory and the external memory to determine whether the processing device can access the internal memory and the external memory as the single addressable memory as a Y-bit word.

2. The method of claim 1 further comprises, within step (b), the processing device addressing the single addressable memory using a multiple data rate.

3. The method of claim 1 further comprises, within step (d), determining whether the internal memory provides a sufficient amount of digital storage.

4. The method of claim 1 further comprises, within step (d) determining whether a strap is active.

5. A computing system comprising:

system memory that stores programming instructions and data; and central processing unit operably coupled to the system memory, wherein the central processing unit produces the data based on the programming instructions and stores the data in the system memory, wherein the central processing unit includes an integrated circuit having:

a processing circuit deposited on a die;

memory deposited on the die, wherein the memory is addressable by the processing circuit; and configuration circuitry deposited on the die, wherein the configuration circuitry is operably coupled to the processing circuit and the memory, and wherein the configuration circuitry reconfigures the memory in response to a determination that the memory is insufficient for a particular function, the memory being reconfigured such that the processing circuit accesses the memory and at least a portion of the system memory as a single addressable memory, and wherein the configuration circuit tests the reconfigured memory and an external memory to determine whether the processing circuit can access the memory and the external memory as the single addressable memory.

6. The computing system of claim 5 further comprises the processing circuit being one of: a digital signal processor, a microprocessor, and a microcontroller.

7. A computing system comprising:

system memory that stores programming instructions and data;

a central processing unit operably coupled to the system memory, wherein the central processing unit produces the data based on the programming instructions and stores the data in the system memory; and a video graphics circuit operably coupled to the central processing unit and the system memory, wherein the video graphics circuit includes an integrated circuit having:

a processing circuit deposited on a die;

memory deposited on the die, wherein the memory is addressable by the processing circuit; and configuration circuitry deposited on the die, wherein the configuration circuitry is operably coupled to the processing circuit and the memory, and wherein the configuration circuitry reconfigures the memory in response to a determination that the memory is insufficient for a particular function, the memory being reconfigured such that the processing circuit accesses the memory and at least a portion of the system memory as a single addressable memory, and wherein the configuration circuit tests the reconfigured memory and an external memory to determine whether the processing circuit can access the memory and the external memory as the single addressable memory.

8. An integrated circuit comprising:

a processing circuit deposited on a die;

configuration circuitry operably coupled to the processing circuit; and memory deposited on the die and operably coupled to the configuration circuitry, wherein the memory is addressable by the processing circuit, and wherein the memory stores programming instructions that, when read by the processing circuit, causes the processing circuit to: (a) reconfigure, in response to a determination that an internal memory is insufficient for a particular function, the internal memory from an X K by Y bit configuration to an X* n K by Y/n bit configuration using the configuration circuitry to produce reconfigured memory; (b) extend an addressing bus to external memory using the configuration circuitry, such that the processing circuit addresses the reconfigured memory and the external memory as a single addressable memory; (c) combine an internal data bus with an external data bus that is coupled to the external memory using the configuration circuitry; and (d) test the reconfigured memory and the external memory to determine whether the processing circuit can access the internal memory and the external memory as the single addressable memory as a Y-bit word.

* * * * *